United States Patent
McGarvey

(10) Patent No.: US 12,389,693 B2
(45) Date of Patent: Aug. 12, 2025

(54) OPTOELECTRONIC DEVICE HAVING A MODULAR PACKAGE

(71) Applicant: SEMICONDUCTOR COMPONENTS INDUSTRIES, LLC, Phoenix, AZ (US)

(72) Inventor: Brian Patrick McGarvey, Templemartin (IE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 493 days.

(21) Appl. No.: 17/664,485

(22) Filed: May 23, 2022

(65) Prior Publication Data

US 2023/0378390 A1    Nov. 23, 2023

(51) Int. Cl.
| | | |
|---|---|---|
| H10F 30/225 | (2025.01) | |
| H10F 39/18 | (2025.01) | |
| H10F 77/00 | (2025.01) | |

(52) U.S. Cl.
CPC .......... *H10F 30/225* (2025.01); *H10F 39/18* (2025.01); *H10F 77/959* (2025.01)

(58) Field of Classification Search
CPC ......... H01L 24/14; H01L 24/16; H01L 24/81; H01L 24/90; H01L 23/3675; H01L 25/167; H01L 31/107; H01L 31/02027; H01L 31/0203; H01L 31/02024; H01L 31/0224; H01L 31/022416; H01L 27/14618; H01L 27/14661; H01L 2224/81815; H01L 2224/14135; H01L 2224/131; H01L 2224/14131; H01L 2224/16145; H01L 2224/48165; H01L 2224/48235; H01L 2224/90; H01L 2224/95091; H01L 2224/951; H01L 2224/4141; H01L 2224/42; H01L 2224/44; H01L 2224/45; H01L 2224/4503; H01L 2224/45032; H01L 2224/47; H01L 2224/48; H01L 2224/4805; H01L 2224/48105; H01L 2224/4811; H01L 27/1443; H01L 27/1446; H01L 27/1469; H01L 27/14607; H01L 27/14627; H01L 27/14632; H01L 27/14643–14663; H01L 27/14687; H01L 27/14634; H01L 27/14636; H01L 27/14806; H01L 27/14812; H01L 27/307; H01L 27/3293;

(Continued)

(56) References Cited

U.S. PATENT DOCUMENTS

| | | | |
|---|---|---|---|
| 6,180,944 B1 * | 1/2001 | Robinson | G01T 1/243 438/107 |
| 10,062,727 B2 * | 8/2018 | McKnight | H01L 27/14618 |
| 10,181,493 B2 * | 1/2019 | Abenaim | H01L 27/1469 |
| 10,748,957 B1 * | 8/2020 | McKnight | H01L 27/14607 |
| 2003/0045028 A1 * | 3/2003 | Tsao | H01L 23/49816 257/E21.511 |
| 2004/0036153 A1 | 2/2004 | Thurgood | |

(Continued)

*Primary Examiner* — Natalia A Gondarenko
(74) *Attorney, Agent, or Firm* — Brake Hughes Bellermann LLP

(57) ABSTRACT

A segmented optoelectronic semiconductor package may help to alleviate stresses resulting from bending that can cause a mechanical defect (e.g., crack) in a detector circuit. The bending can result from thermal growth/shrinkage of parts used in the optical electronic package and may be more pronounced for high aspect ratio detector circuits. The segmentation of the disclosed semiconductor package can create seams that allow the parts to flex without breaking. As a result, the disclosed semiconductor package may facilitate high aspect ratio optical detection over a wide temperature range.

20 Claims, 8 Drawing Sheets

(58) Field of Classification Search
CPC ......... H01L 27/14665; H01L 27/14669; H01L 27/14678; H01L 27/14683; H01L 27/14681; H01L 27/14692; H01L 2924/12043; H01L 2224/48111; H01L 2224/48138; H01L 2224/48145; H05K 2201/1053; H05K 2201/10151; H05K 3/3436; H05K 1/18; A61B 6/032; A61B 6/4233; G01J 2001/442; G01J 2001/4466; G01J 1/44; H04N 5/2253; H04N 5/335; H04N 5/374; H10F 30/225; H10F 19/10; H10F 19/20; H10F 19/40; H10F 19/50; H10F 77/50; H10F 77/95; H10F 77/935; H10F 77/937; H10F 77/939; H10F 77/959; H10F 77/955; H10F 39/103; H10F 39/107; H10F 39/18; H10F 39/8037; H10F 39/804; H10F 39/90; H10F 39/95; H10F 55/15; H10F 55/155; H10F 55/165; H10F 55/20; H10F 55/25; H10F 55/207; H10F 55/255
USPC ............... 257/432, 433, 447, 448, 777, 778, 257/E25.032, E27.133, E31.127
See application file for complete search history.

(56) References Cited

U.S. PATENT DOCUMENTS

| | | | |
|---|---|---|---|
| 2004/0104460 A1* | 6/2004 | Stark | H01L 21/50 438/106 |
| 2009/0314947 A1* | 12/2009 | Goushcha | G01T 1/20183 250/363.01 |
| 2010/0031996 A1* | 2/2010 | Basol | H10F 77/935 156/308.2 |
| 2011/0031509 A1* | 2/2011 | Kirihara | H10H 20/8506 257/E31.099 |
| 2013/0286707 A1* | 10/2013 | Crisp | H01L 24/24 365/63 |
| 2014/0270057 A1* | 9/2014 | Bartolome | G01N 23/046 378/19 |
| 2015/0145078 A1 | 5/2015 | Ng | |
| 2017/0229416 A1* | 8/2017 | Hall | H01L 25/0657 |
| 2017/0309660 A1* | 10/2017 | Chappo | H01L 23/3675 |
| 2018/0136344 A1* | 5/2018 | Nelson | G01T 1/20181 |
| 2020/0088859 A1* | 3/2020 | Shepard | G01S 17/42 |
| 2020/0209367 A1* | 7/2020 | Qiu | G01S 7/4813 |
| 2021/0146834 A1* | 5/2021 | Lu | H04N 23/55 |
| 2021/0351222 A1 | 11/2021 | McGarvey | |

* cited by examiner

OPTOELECTRONIC DEVICE HAVING A MODULAR PACKAGE

FIELD OF THE DISCLOSURE

The present disclosure relates to circuit packaging and more specifically, to an optoelectronic package having a modular aspect to accommodate flexing.

BACKGROUND

A single-photon avalanche diode (SPAD) can be configured to detect light with a very high sensitivity. For example, a SPAD may be sensitive to light in a range of 1 to 1000 photons. A silicon photomultiplier (SiPM) can include an array of SPADS on a silicon substrate as pixels to help increase a field-of-view of the detection.

SUMMARY

In some aspects, the techniques described herein relate to an optoelectronic package including: a circuit substrate having a longer dimension aligned with a long axis and a shorter dimension aligned with a short axis; and a carrier fixedly coupled (e.g., soldered) to the circuit substrate, the carrier including a plurality of substrate modules arranged in a sequence aligned with the long axis, wherein seams are formed between adjacent pairs of substrate modules in the sequence so that, in response to the circuit substrate being curved along the long axis, the carrier flexes.

In some aspects, the techniques described herein relate to an optoelectronic package, wherein: the substrate modules are a ceramic material having a first coefficient of thermal expansion (i.e., CTE) and the circuit substrate is a glass-reinforced epoxy laminate material having a second coefficient of thermal expansion; and the circuit substrate is curved along the long axis due to a difference between the first coefficient of thermal expansion and the second coefficient of thermal expansion during a thermal cycle.

In some aspects, the techniques described herein relate to an optoelectronic package, wherein the thermal cycle is in a range from −55 degrees Celsius to +150 degrees Celsius.

In some aspects, the techniques described herein relate to an optoelectronic package, wherein an aspect ratio of the longer dimension to the shorter dimension is greater than or equal to 2 to 1 (e.g., 4 to 1).

In some aspects, the techniques described herein relate to an optoelectronic package, further including: a silicon photomultiplier including a plurality of pixel array circuits bonded to the carrier in a sequence that is staggered with respect to a direction aligned with the long axis.

In some aspects, the techniques described herein relate to an optoelectronic package, wherein: adjacent pairs of the plurality of pixel array circuits are separated by a gap in a direction aligned with the short axis and overlap by an overlap in the direction aligned with the long axis.

In some aspects, the techniques described herein relate to an optoelectronic package, wherein the silicon photomultiplier includes at least two pixel array circuits in the sequence.

In some aspects, the techniques described herein relate to an optoelectronic package, wherein each of the plurality of substrate modules has a top surface configured to support at least one of the plurality of pixel array circuits, the top surface including a first rectangular portion and a second rectangular portion, the first rectangular portion joined to the second rectangular portion along a length of a side.

In some aspects, the techniques described herein relate to an optoelectronic package, wherein a first pixel array circuit of a pair of pixel array circuits is bonded to the first rectangular portion and a second pixel array circuit of the pair of pixel array circuits is bonded to the second rectangular portion.

In some aspects, the techniques described herein relate to an optoelectronic package, wherein each of the plurality of substrate modules has a first edge configured to couple to a previous substrate module in the sequence and a second edge configured to couple with a subsequent substrate module in the sequence, the first edge having a first key feature and the second edge having a second key feature, the first key feature and the second key feature having teeth, the teeth configured to interlock when brought together at a seam.

In some aspects, the techniques described herein relate to a silicon photomultiplier including: a circuit substrate having a longer dimension and a shorter dimension aligned within a plane; a carrier fixedly coupled to the circuit substrate, the carrier including a plurality of substrate modules arranged in a sequence aligned with the longer dimension wherein seams are formed between adjacent pairs of substrate modules in the sequence so that, in response to the circuit substrate being deflected from the plane, the carrier flexes; a window including a plurality of glass lids that bonded to sidewalls of the carrier in a sequence, wherein glass seams are formed between adjacent pairs of glass lids in the sequence; and a plurality of pixel array circuits bonded to the carrier in a sequence that is staggered with respect to a direction aligned with the longer dimension, the silicon photomultiplier configured to detect light through the window.

In some aspects, the techniques described herein relate to a silicon photomultiplier, wherein the light is a LIDAR signal.

In some aspects, the techniques described herein relate to a silicon photomultiplier, wherein: the substrate modules are a ceramic material having a first coefficient of thermal expansion and the circuit substrate is a glass-reinforced epoxy laminate material having a second coefficient of thermal expansion; and the circuit substrate is deflected from the plane due to a difference between the first coefficient of thermal expansion and the second coefficient of thermal expansion during a thermal cycle.

In some aspects, the techniques described herein relate to a silicon photomultiplier, wherein the thermal cycle is in a range from −55 degrees Celsius to +150 degrees Celsius.

In some aspects, the techniques described herein relate to a silicon photomultiplier, wherein an aspect ratio of the longer dimension to the shorter dimension is greater than or equal to 2 to 1 (e.g., 4 to 1).

In some aspects, the techniques described herein relate to a silicon photomultiplier, wherein: adjacent pairs of the plurality of pixel array circuits are separated by a gap in a direction aligned with the shorter dimension and overlap by an overlap in the direction aligned with the longer dimension.

In some aspects, the techniques described herein relate to a silicon photomultiplier, wherein the silicon photomultiplier includes at least two pixel array circuits in the sequence.

In some aspects, the techniques described herein relate to a silicon photomultiplier, wherein: each of the plurality of substrate modules has a top surface that includes a first rectangular portion and a second rectangular portion, the first rectangular portion joined to the second rectangular portion along a length of a side; and a first pixel array circuit of a pair of pixel array circuits is bonded to the first rectangular portion and a second pixel array circuit of the pair of pixel array circuits is bonded to the second rectangular portion.

In some aspects, the techniques described herein relate to a silicon photomultiplier, wherein each of the plurality of substrate modules has a first edge configured to couple to a previous substrate module in the sequence and a second edge configured to couple with a subsequent substrate module in the sequence, the first edge having a first key feature and the second edge having a second key feature, the first key feature and the second key feature having teeth configured to interlock when brought together at a seam.

In some aspects, the techniques described herein relate to an optical receiver including: an optical assembly configured to focus light from a field of view; and a silicon photomultiplier including: a printed circuit board having a longer dimension aligned with a long axis and a shorter dimension aligned with a short axis; a carrier soldered to the printed circuit board, the carrier including a plurality of substrate modules arranged in a sequence aligned with the long axis wherein seams are formed between adjacent pairs of substrate modules in the sequence so that the carrier can flex as the printed circuit board is curved along the long axis; a window including a plurality of glass lids that bonded to sidewalls of the carrier in a sequence, wherein glass seams are formed between adjacent pairs of glass lids in the sequence; and a plurality of pixel array circuits bonded to the carrier in a sequence that is staggered with respect to a direction aligned with the long axis, the silicon photomultiplier configured to detect the light from the field of view through the window.

In some aspects, the techniques described herein relate to an optical receiver, wherein the glass seams of the window do not overlap with the seams of the carrier.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

A semiconductor photomultiplier (i.e., photomultiplier) may have a detection sensitivity that is suitable for detecting backscattered light at very low intensities. Accordingly, the photomultiplier may be used in an optical receiver for a vehicle LIDAR system to help with crash avoidance and/or navigation. In these implementations, a larger field-of-view may be desired, but the larger field-of-view may require a larger (e.g., longer) photomultiplier, which can create durability problems when operated in a harsh environment, such as in a vehicle (e.g., car, truck, etc.).

Optoelectronics for a vehicle may be required to operate reliably over a thermal cycle in a range from −55 degrees Celsius to +150 degrees Celsius. Coefficients of thermal expansion (i.e., CTEs) of materials used in the photomultiplier may cause flexing or forces that can damage (e.g., crack) some components when cycled over this range. The likelihood of cracking can become more pronounced as a size (e.g., aspect ratio) of the photomultiplier is increased. Thus, reliable operation of a larger (i.e., longer) photomultiplier over a temperature range may pose a technical problem.

The present disclosure describes an optoelectronic package that can address this technical problem. The disclosed optoelectronic package includes features that provide a mechanical stress relief. The stress relief can reduce or eliminate cracks due to the flexing (i.e., bowing) of long, narrow (i.e., high-aspect ratio) optoelectronic circuits. The disclosed optoelectronic package may therefore improve a durability of the optoelectronic circuits, which may be useful in harsh environments, such as those where operating over a large temperature range is required. For example, the disclosed optoelectronic package may support a photomultiplier having a long array of pixels configured to detect light.

Figure 1:
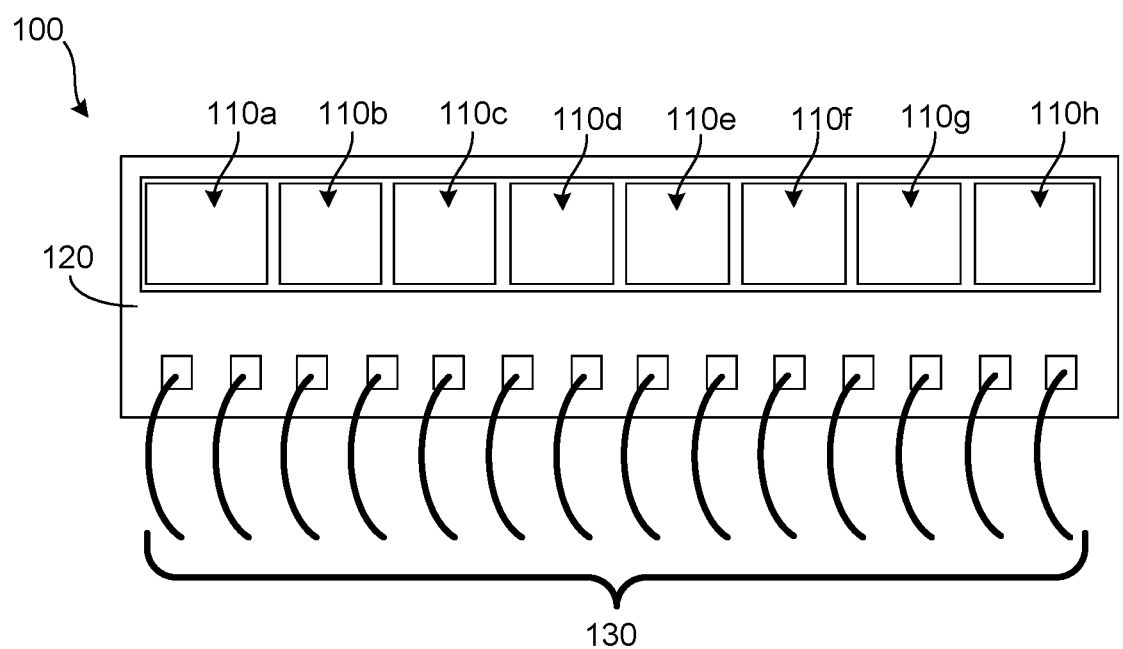
FIG. 1 is a top view of a pixel array circuit according to an implementation of the present disclosure.

FIG. 1 is a top view of a pixel array circuit according to an implementation of the present disclosure. The pixel array circuit 100 may include a die 120 on which an array of pixels is fabricated. The die may be a semiconductor material, such as silicon (Si), germanium (Ge) or a III-V combination of materials. For the purposes of this disclosure, a Si die will be assumed. Each pixel 110$a$-$h$ may be a single-photon avalanche diode (i.e., SPAD). The pixels may be arranged in an array (i.e., sequence) that is linear and that has a length that is determined based on a system requirement, with some possible lengths being 8, 12, and 16 pixels. Pixels of the pixel array circuit 100 may be square or rectangular and may have a size that is less than or equal to 2 millimeters (mm) (e.g., 1 mm×1 mm). In a possible implementation, a first pixel 110$a$ and a last pixel 110$h$ may have a larger width than other pixels in the array to compensate for an overlap, which will be discussed below. The die 120 may further include bond pads to which wires 130 may be bonded in order to provide an electrical connection between the pixel array circuit 100 and other electronics. The pixel array circuit 100 may have an aspect ratio defined in terms of columns of pixels versus rows of pixels, which is 8 to 1 for the implementation shown in FIG. 1.

Figure 2:
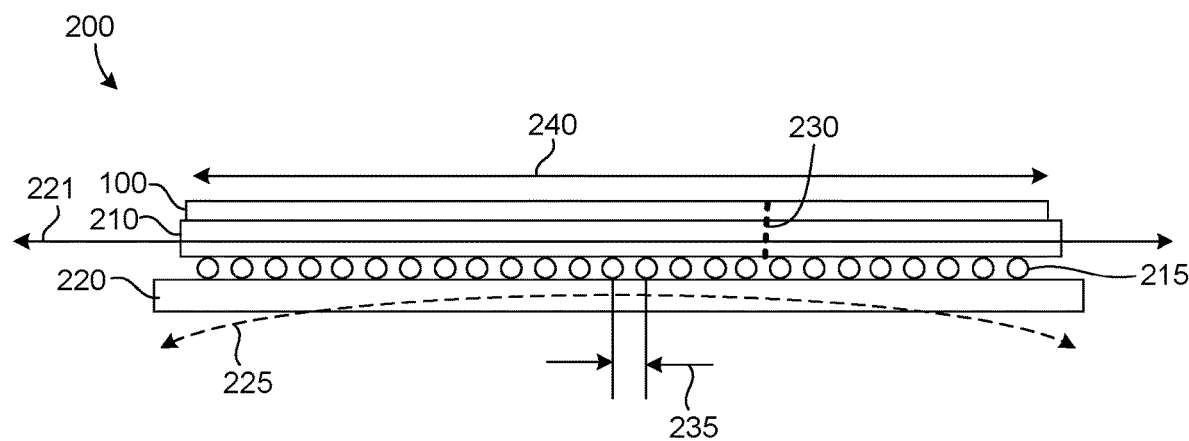
FIG. 2 is a side view of a photomultiplier according to a possible implementation of the present disclosure.

FIG. 2 is a side view of a photomultiplier according to an implementation of the present disclosure. The photomultiplier 200 includes a pixel array circuit 100 that is bonded to a carrier substrate (i.e., carrier, substrate, etc.). The bond material may be an epoxy applied in an automated pick-and-place process. The pixel array circuit 100 may be electrically connected (e.g., wire bonded) to the carrier 210, which in turn can be electrically connected to a circuit substrate. In a possible implementation, the circuit substrate is a printed circuit board (i.e., PCB 220). The PCB 220 can be fixedly coupled to the carrier 210 by soldering. For example, the PCB can be soldered to the carrier 210 with a plurality of solder balls 215 in order to fixedly couple the PCB 220 and the carrier 210. For example, the solder balls 215 may be part of a ball grid array connection between the PCB 220 and the carrier 210. In a possible implementation, the solder balls are less than 300 microns in diameter (e.g., 250 microns).

The carrier 210 may be a ceramic material (e.g., sintered ceramic) or a molded material (e.g., injected molded polymer, molded epoxy, etc.). While the disclosure is not limited to a ceramic carrier (i.e., package), a ceramic carrier will be discussed because it includes thermal properties that may be desirable for some applications. These thermal properties can include its ability to efficiently propagate heat away from the silicon and its low thermal expansion rate (i.e., first coefficient of thermal expansion (CTE)). For example, the ceramic may change a dimension with temperature at a rate that is 5 parts per million per degree Celsius (i.e., first CTE=5 ppm/° C.).

The PCB 220 can be a glass-reinforced epoxy laminate material common to electronics, such as FR4. The PCB 220 may have a different thermal expansion rate (i.e., second CTE) than the ceramic in response to a temperature change. For example, the PCB 220 may change dimension with temperature at a rate that is 30 parts per million per degree Celsius (i.e., second CTE=30 ppm/° C.). The difference between the first CTE of the ceramic and the second CTE of the PCB can create a bending force 225 that can bend (i.e., flex) the photomultiplier 200. This flexing can cause a crack (or cracks) in the carrier 210, a crack (or cracks) in the pixel array circuit 100, or a crack (or cracks) in the carrier 210 and the pixel array circuit 100. In other words, bowing (i.e., bending) of the PCB/package/die can result in cracking of the silicon die if one long die/package is used.

The pixel array circuit 100 may include an array of pixels that is aligned along a longer dimension of the pixel array circuit 100 and a shorter dimension transverse to the longer dimension. Likewise, the carrier 210 may have a corresponding longer dimension and a shorter dimension. The longer dimension and shorter dimension may be aligned with a plane 221 defined by the carrier 210. The bending force 225 on the PCB 220 can flex the carrier 210 so that it is deflected from the plane 221.

A crack 230 in the photomultiplier 200 can cause an electrical malfunction by breaking a circuit connection or can cause a mechanical or optical malfunction by changing a shape or response of the photomultiplier 200. The crack 230 may include any fissure, break, or void in a material that should otherwise be intact. Cracking due to the bending force 225 may be more likely when a solder ball density 235 is high (e.g., solder ball pitch 1 mm) and/or when a length 240 of the pixel array circuit 100 is long (e.g., 30 mm).

The present disclosure describes an optoelectronic package that is modular so that a long (and narrow) package can be created as a sequence of modules. In particular, the disclosed carrier may include a plurality of substrate modules bonded end-to-end in a sequence. The bond may be made using a flexible adhesive (e.g., flexible epoxy) so that the seams formed between the substrate modules add a flexibility to the carrier. The flexibility can enable the carrier to flex (i.e., bend) without cracking as the PCB 220 is curved along a long axis of the package. In other words, the seams can provide a stress relief to a bending force 225, as shown in FIG. 2.

Figure 3:
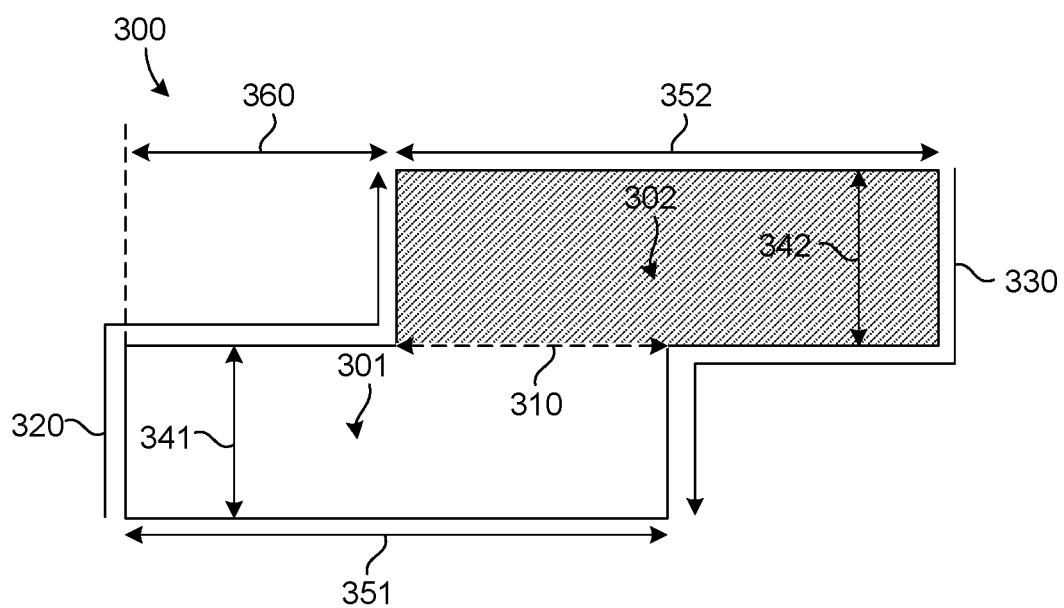
FIG. 3 is a top view of a substrate module according to an implementation of the present disclosure.

FIG. 3 is a top view of a substrate module 300 according to a possible implementation of the present disclosure. The top view shows a top surface of the substrate module 300. The top surface corresponds to the shape of the substrate module 300 in any cut plan along the view direction shown. In other words, a bottom surface of the substrate module may be the same size/shape as the top surface of the substrate module. The top surface includes a first rectangular portion 301 (i.e., not hashed portion) and a second rectangular portion 302 (i.e., hashed portion). The first rectangular portion 301 and the second rectangular portion 302 are joined along a length 310 of a side of the first rectangular portion (and the second rectangular portion). In other words, the rectangular portions may be considered offset (i.e., staggered position) by an offset 360 so that a first edge 320 (i.e., left edge) and a second edge 330 (i.e., right edge) are stepped.

As shown in FIG. 3, the first edge 320 may have a step (i.e., first step) from the first rectangular portion 301 to the second rectangular portion 302, while the second edge 330 may have a step (i.e., second step) from the second rectangular portion 302 to the first rectangular portion 301. The complementary steps allow a plurality of substrate modules to be arranged in a sequence where the first edge and the second edge interlock. The steps may provide stability and strength to a seam formed between adjacent substrate modules in an array of substrate modules. In other words, the step shape (i.e., step) of the first edge 320 and the second edge 330 may help to reduce a shear force that would otherwise be present at a joint if the step did not exist.

The first rectangular portion 301 may have a first length 351 and a first height 341 and the second rectangular portion 302 may have a second length 352 and a second height 342. In a possible implementation, the first height 341 may equal the second height 342. In a possible implementation, the first length 351 may equal the second length 352. In a possible implementation, the offset 360 may equal one half of the first length 351 and/or the second length 352. In a possible implementation, the length 310 connecting the rectangular portions may be equal to one half of the first length 351 and/or the second length 352.

Figure 4:
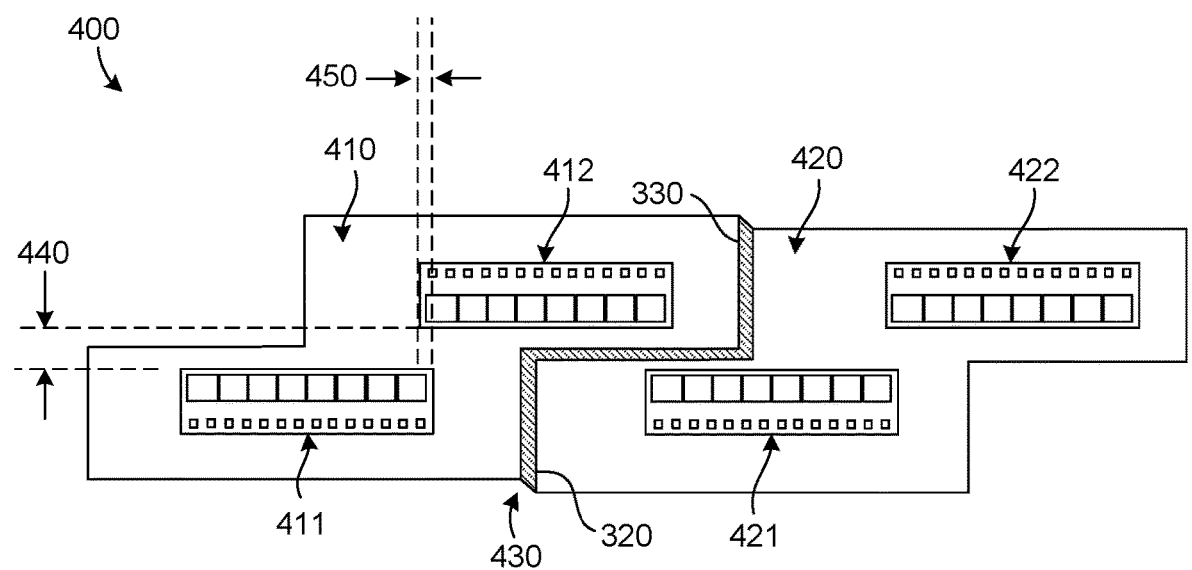
FIG. 4 is a top view of a carrier including pixel array circuits according to an implementation of the present disclosure.

FIG. 4 illustrates a top view of a carrier including pixel array circuits according to a possible implementation of the present disclosure. The illustration is to aid in a description and the dimensions and relative positions shown are not to scale. As shown in FIG. 4, the carrier 400 includes two substrate modules arranged in an end-to-end sequence, though any number of substrate modules to make the carrier longer or shorter may be possible. The carrier 400 for an optoelectronic package includes a first substrate module 410 and a second substrate module 420. The substrate modules are as shown in FIG. 2 and described above.

The substrate modules are attached at interlocking edges (i.e., stepped edges). The second edge 330 of the first substrate module 410 and the first edge 320 of the second substrate module 420 can be brought into contact to form a seam 430 between the adjacent substrate modules. In a possible implementation, the first substrate module 410 and the second substrate module 420 are mechanically coupled at the seam 430 by a flexible adhesive (e.g., flexible epoxy). The flexible adhesive allows the seam 430 to flex along a direction aligned with the pixels.

Two pixel-array circuits are attached (e.g., bonded) to each substrate module (i.e., at a top surface). The first substrate module 410 has a first pixel-array circuit 411 disposed (e.g., bonded) in a first rectangular portion of the first substrate module and a second pixel array circuit 412 disposed (e.g., bonded) in a second rectangular portion of the first substrate module 410. The second substrate module 420 has a third pixel-array circuit 421 disposed (e.g., bonded) in a first rectangular portion of the second substrate module and a fourth pixel-array circuit 422 disposed (e.g., bonded) in a second rectangular portion of the second substrate module 420.

The pixel array circuits may be arranged similarly (e.g., the same) on each substrate module. The first pixel-array circuit 411 and the second pixel array circuit 412 can be arranged so that they are separated by a gap 440 in a first direction that is transverse to a dimension in line with the pixel array (i.e., array dimension, long dimension). The first pixel-array circuit 411 and the second pixel array circuit 412 may be oriented so that the bond pads face edges (e.g., top and bottom edges, as shown in FIG. 4) of the first substrate module 410 and second substrate module 420, respectively. This arrangement may help to minimize the gap 440 between pixels and may facilitate connecting the pixel array electrically to external circuits. The first pixel-array circuit 411, second pixel array circuit 412, third pixel-array circuit 421, and fourth pixel-array circuit 422 form a pixel array that is approximately linear because the gap 440 dimension may be small (e.g., 200 microns).

The first pixel-array circuit 411 and the second pixel array circuit 412 can be arranged so that they overlap by an overlap 450 in a second direction that is in-line with the array dimension. As mentioned previously, pixels in the overlap region (i.e., overlapping pixels) may be larger than other pixels in order to compensate for the overlap 450. Accordingly, the pixels in each overlap may be larger by an amount corresponding to the overlap 450 so that the overall pixel array length is not shortened by the overlap. The overlap may be made very small (e.g., 100 microns) and may be limited only by a pick and place accuracy and width of the seam.

Figure 5:
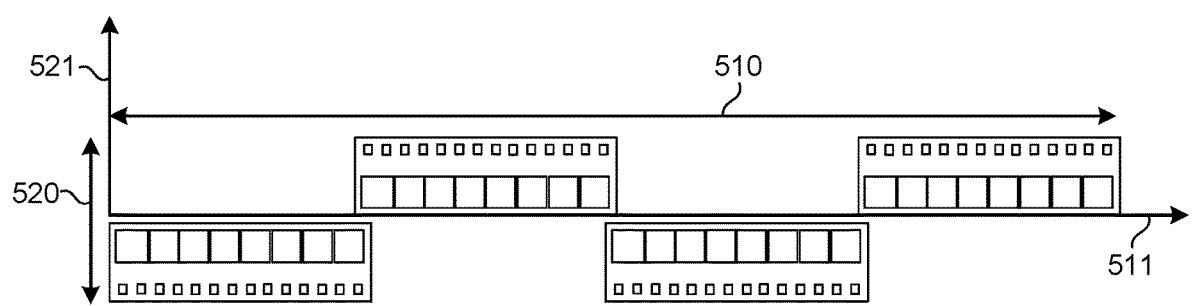
FIG. 5 is a top view of a plurality of pixel array circuits in a sequence that is staggered according to an implementation of the present disclosure.

FIG. 5 illustrates pixel array circuits in a staggered sequence according to an implementation of the present disclosure. The pixel array circuits may be electrically addressed and combined as an array of pixels in a silicon photomultiplier. The array of pixels may have a longer dimension 510 determined by a number of pixels in the array and the overlap between pixel array circuits. The longer dimension 510 may be aligned with a long axis 511 (i.e., horizontal axis) that runs in a direction defined by the pixels in the array. The array of pixels may also have a shorter dimension 520 in a direction along a short axis 521 (i.e., vertical axis), which is transverse to the long axis 511. The sequence (i.e., array) of pixel array circuits may be staggered with respect to the long axis 511. In other words, the pixel array circuits in the array may alternate positions on opposite sides of the long axis 511

The ratio of the longer dimension 510 to the shorter dimension 520 defines an aspect ratio of the array of pixels, which can correspond to an aspect ratio of the optoelectronic package. The modular optoelectronic package described herein facilitates high aspect ratio (e.g., 2:1) silicon photomultipliers that are robust to thermal cycling. In other words, the array of pixels may be made long and narrow using the disclosed packaging techniques. FIG. 5 illustrates a 32:1 array of pixels, which can have a longer dimension 510 of approximately 32 mm and a shorter dimension 520 of approximately 5 mm when the pixel dimensions are approximately 1 mm by 1 mm. The actual dimensions of the array and the optoelectronic package may depend on a variety of parameters, such as pixel size, pixel arrangement (e.g., gap, overlap), number of pixels per pixel array circuit, and number of pixel array circuits. An advantage of the present packaging approach is its support for a wide range of possible configurations and dimensions.

Figure 6A:
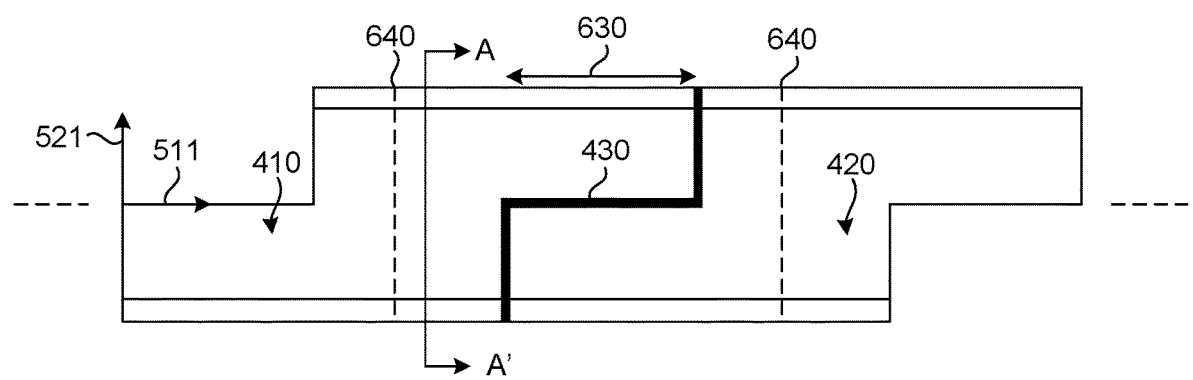
FIG. 6A is a top view of a carrier including a plurality of substrate modules according to an implementation of the present disclosure.

FIG. 6A is a top view of a carrier including a plurality of substrate modules according to an implementation of the present disclosure. The carrier includes a first substrate module 410 and a second substrate module 420 arranged in a sequence aligned with a long axis 511. A seam 430 is formed between the adjacent pair of substrate modules. A region along the carrier that includes the seam 430 may be referred to as a seam region 630. For simplicity, the pixel array circuits and the circuit substrate of the optoelectronic package are not shown.

Figure 6B:
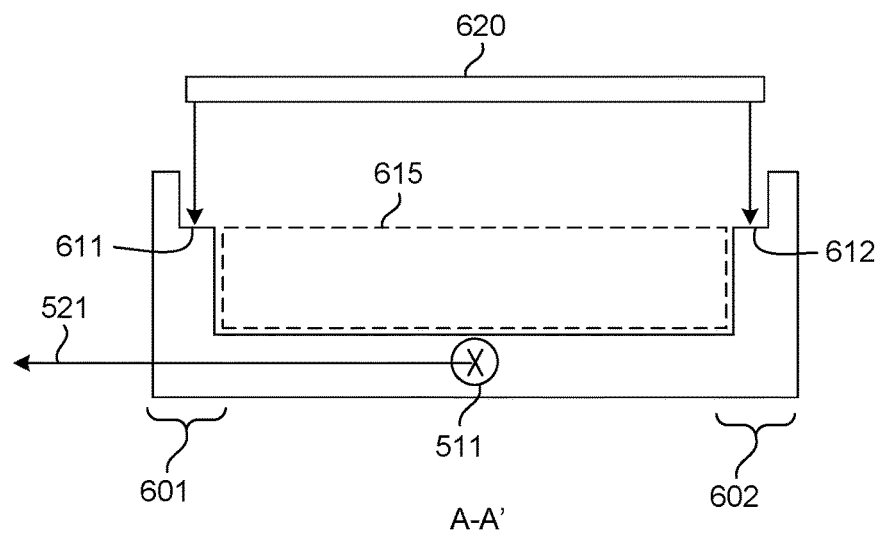
FIG. 6B is a side view of the carrier including a glass lid according to an implementation of the present disclosure.

FIG. 6B is a side view of the carrier according to an implementation of the present disclosure. The side view is along the long axis 511 of the carrier. As shown, each substrate module of the carrier can include a first sidewall 601 and a second sidewall 602. The sidewalls may be unitary with the rest of the substrate module or may be attached (e.g., bonded) to the rest of the substrate module during a substrate module fabrication process. The first sidewall 601 may include a first ledge 611 and the second sidewall 602 may include a second ledge 612. The first ledge 611 and the second ledge 612 are configured to hold a glass lid 620. The substrate module and the glass lid define a cavity 615, which can house the pixel-array circuits. The glass lid 620 may be configured to pass light so that the pixels of the pixel-array circuits can detect light after passing through the glass lid. In a possible implementation (not shown), the glass lid may further include an optical element, such as a filter, a lens, or a diffractive optical element (DOE) to filter and/or guide the light as it passes through the window. The glass lid 620 may also provide protection to the pixel-array circuits in the cavity 615 from damage and/or contamination.

A plurality of the glass lids may be bonded to the sidewalls of the carrier to form a window for the pixel array circuits of a silicon photomultiplier. A bond material (e.g., ultra-violet cured epoxy) for the glass lids may be flexible. As shown in FIG. 6A, glass seams 640 are formed between adjacent pairs of glass lids in the window. In a possible implementation, the glass lids are arranged (i.e., along the long axis 511) so that none of the glass seams 640 are in the seam region 630 of the carrier. In other words, the glass seams between glass lids do not overlap with the carrier seams of the carrier.

The arrangement shown in FIG. 6A may be repeated by adding additional substrate modules and additional glass lids to either the first substrate module 410 or the second substrate module 420. The offset between the glass seams 640 and the seams of the carrier may help provide strength to the optoelectronic package.

Returning to FIG. 3, the first edge 320 and the second edge 330 of each substrate module 300 may have an additional key feature (i.e., key) on a smaller scale than the step features described previously. In other words, if the step features are considered as a larger key, then the substrate modules may further include a smaller key along each interlocking edge.

Figure 7:
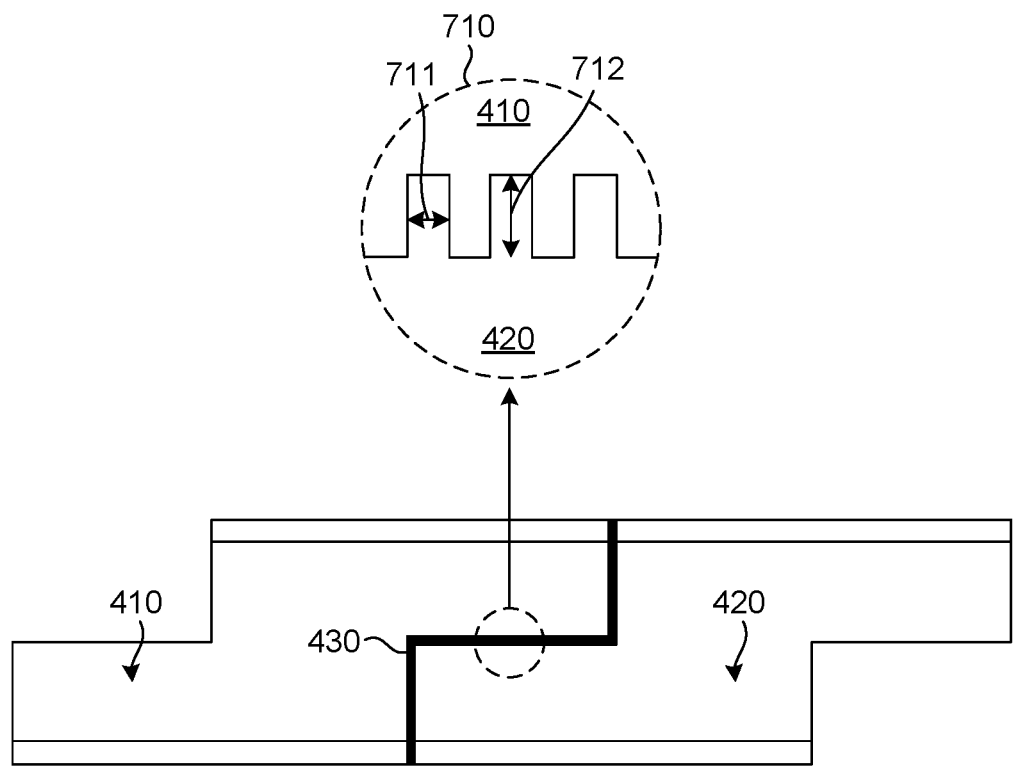
FIG. 7 is a top view of a carrier including a seam between edges that includes a key feature according to an implementation of the present disclosure.

FIG. 7 is a top view of a carrier including a seam between edges that includes a key feature according to an implementation of the present disclosure. As shown, a seam 430 is formed between a first substrate module 410 and a second substrate module 420. A magnified view of the seam 430 is shown in the inset 710. A second edge 330 of the first substrate module 410 may have a first key feature and a first edge 320 of the second substrate module 420 may have a second key feature that are complementary. The key features may have essentially the same profile (e.g., a comb profile) which may be shifted spatially so that the key features mate with one another. Various profiles may be used to increase a surface area of the seam for bonding and to provide different bond directions to strengthen the seam against shear forces.

For the implementation shown in FIG. 7, the edges include teeth that are configured to interlock when brought together at a seam. Each key feature may have a comb profile that includes a plurality of teeth. The teeth may be regularly spaced and can have a tooth width 711 and a tooth height 712 that provide additional bonding surfaces to strengthen a bond at the seam 430. In a possible implementation, a tooth width 711 (i.e., $t_w$) may be less than or equal to 1 mm (e.g., 0.3 mm≤$t_w$≤0.5 mm). In a possible implementation, a tooth height 712 (i.e., $t_h$) may be less than or equal to 3 mm (e.g., 1 mm≤$t_h$≤2 mm).

Figure 8:
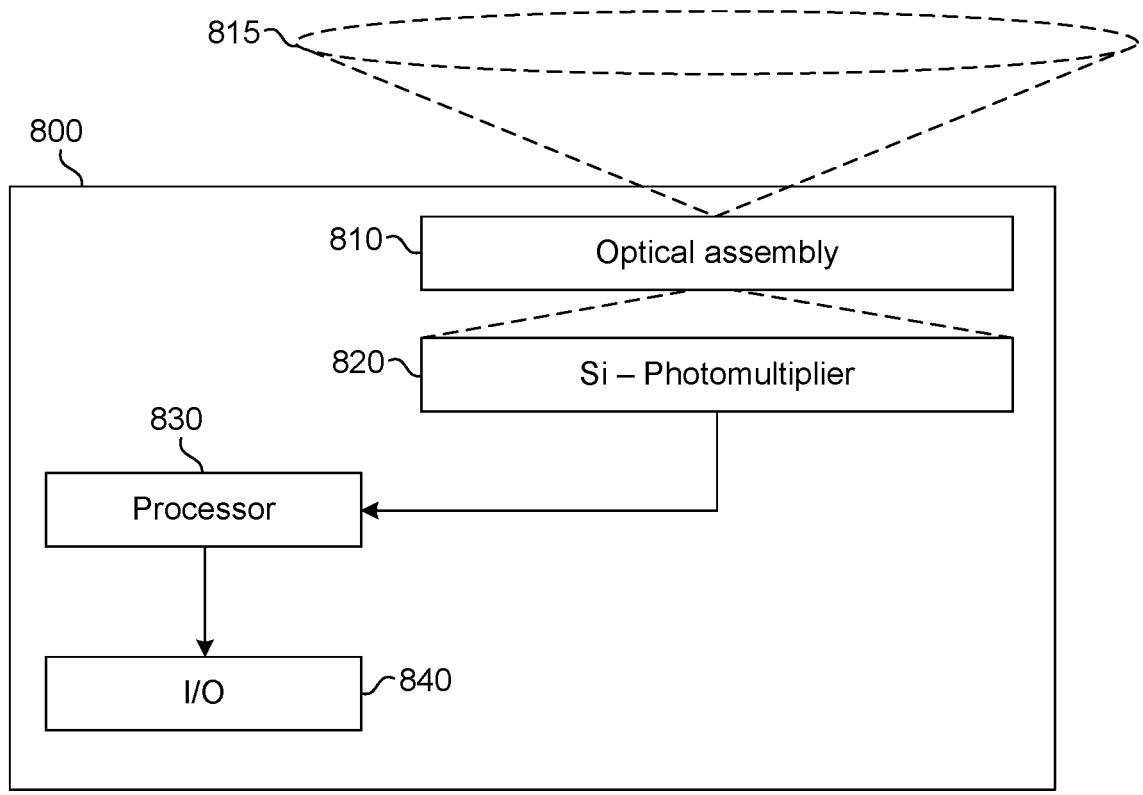
FIG. 8 is a block diagram of an optical receiver according to an implementation of the present disclosure.

FIG. 8 is a block diagram of an optical receiver according to an implementation of the present disclosure. The optical receiver 800 includes an optical assembly 810 configured to receive (e.g., focus) light (e.g., in a range from 400 nanometers (nm) to about 800 nm) from a field of view 815. The optical assembly 810 may include one or more of a filter, a lens (e.g., lenslet array, light guide, compound lens), and a polarizer to process the light for detection by a silicon photomultiplier 820.

The optical receiver further includes a silicon photomultiplier 820 configured to detect light transmitted to the silicon photomultiplier 820 from the optical assembly 810. In a possible implementation, the silicon photomultiplier 820 and the optical assembly 810 can be integrated together. For example, a window of the silicon photomultiplier 820 can include a lens. The silicon photomultiplier 820 is configured to convert received light into an electric signal (e.g., voltage or current). A plurality of pixel array circuits, each including a linear array of pixels (e.g., 8 pixels, 12 pixels, 16 pixels, etc.) can be arranged in a sequence to form a high aspect ratio (e.g., 2:1) pixel array. The field of view 815 of the optical receiver may have a shape (e.g., aspect ratio) that corresponds with the high aspect ratio pixel array.

The silicon photon multiple may be packaged in a modular optoelectronic package that has enough flexibility to accommodate flexing due to thermal cycles without damage to the circuitry and/or package. The optoelectronic package (i.e., package) includes a circuit substrate having a longer dimension aligned with a long axis and a shorter dimension aligned with a short axis. The package further includes a carrier fixedly coupled (e.g., soldered) to the circuit substrate (e.g., via a ball grid array). The carrier includes a plurality of substrate modules arranged in a sequence aligned with the long axis. Seams are formed between adjacent pairs of the substrate modules so that the carrier (and pixel array circuits) can flex as the circuit substrate is curved (i.e., bended) along the long axis. The package further includes a window including a plurality of glass lids that are bonded to sidewalls of the carrier in a (continuous) sequence. The glass seams of the window are arranged so that they do not overlap with the seams of the carrier.

The circuit substrate may include circuitry to process the electrical signals from the silicon photomultiplier 820. For example, the optical receiver may include a processor 830 to convert the signals into information (e.g., an image) and input/output circuitry 840 to communicate the information with other systems. In a possible implementation the optical receiver 800 is part of a light detection and ranging (LIDAR) system. The lidar system may be implemented in a vehicle platform, such as a passenger vehicle.

In the specification and/or figures, typical embodiments have been disclosed. The present disclosure is not limited to such exemplary embodiments. For example, while approximately linear arrays (i.e., one row of pixels) have been discussed, the techniques described herein may be applied to two-dimensional (2D) arrays of pixels (i.e., more than one row of pixels).

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. An optoelectronic package comprising:
   a circuit substrate having a longer dimension aligned with a long axis and a shorter dimension aligned with a short axis; and
   a carrier fixedly coupled to the circuit substrate, the carrier including a plurality of substrate modules coupled together at seams between pairs of substrate modules with flexible adhesive so that the plurality of substrate modules are arranged in a sequence aligned with the long axis, the plurality of substrate modules each being a monolithic structure including a first rectangular portion spatially offset from a second rectangular portion to define a step edge at the seams.

2. The optoelectronic package according to claim 1, wherein:
   the substrate modules are a ceramic material having a first coefficient of thermal expansion and the circuit substrate is a glass-reinforced epoxy laminate material having a second coefficient of thermal expansion; and
   the circuit substrate is curved along the long axis due to a difference between the first coefficient of thermal expansion and the second coefficient of thermal expansion during a thermal cycle.

3. The optoelectronic package according to claim 2, wherein the thermal cycle is in a range from −55 degrees Celsius to +150 degrees Celsius.

4. The optoelectronic package according to claim 1, wherein an aspect ratio of the longer dimension to the shorter dimension is greater than or equal to 2 to 1.

5. The optoelectronic package according to claim 1, wherein the sequence is a first sequence and the optoelectronic package further includes:
   a plurality of pixel array circuits bonded to the carrier in a second sequence that is staggered with respect to a direction aligned with the long axis.

6. The optoelectronic package according to claim 5, wherein the direction aligned with the long axis is a first direction and:
   adjacent pairs of the plurality of pixel array circuits are separated by a gap in a second direction aligned with the short axis and overlap by an overlap in the direction aligned with the long axis.

7. The optoelectronic package according to claim 5, wherein two pixel array circuits are coupled to each substrate module in the sequence.

8. The optoelectronic package according to claim 5, wherein a first pixel array circuit of a pair of pixel array circuits is bonded to the first rectangular portion and a second pixel array circuit of the pair of pixel array circuits is bonded to the second rectangular portion.

9. The optoelectronic package according to claim 1, wherein each of the plurality of substrate modules has a first edge configured to couple to a previous substrate module in the sequence and a second edge configured to couple with a subsequent substrate module in the sequence, the first edge having a first key feature and the second edge having a second key feature, the first key feature and the second key feature having teeth, the teeth configured to interlock when brought together at a seam.

10. A silicon photomultiplier comprising:
    a circuit substrate having a longer dimension and a shorter dimension aligned within a plane;
    a carrier fixedly coupled to the circuit substrate, the carrier including a plurality of substrate modules, each substrate module being a monolithic structure including a first rectangular portion spatially offset from a second rectangular portion to define a step edge, the plurality of substrate modules arranged in a sequence aligned with the longer dimension wherein seams are formed at the step edge between adjacent pairs of substrate modules in the sequence so that the carrier flexes in response to the circuit substrate being deflected from the plane;
    a window including a plurality of transparent lids that bonded to sidewalls of the carrier in a sequence of transparent lids, wherein seams are formed between adjacent pairs of transparent lids in the sequence of transparent lids; and
    a plurality of pixel array circuits bonded to the carrier in a sequence that is staggered with respect to a direction aligned with the longer dimension, the silicon photomultiplier configured to detect light through the window.

11. The silicon photomultiplier according to claim 10, wherein the light is a light detection and ranging (LIDAR) signal.

12. The silicon photomultiplier according to claim 10, wherein:
    the substrate modules are a ceramic material having a first coefficient of thermal expansion and the circuit substrate is a glass-reinforced epoxy laminate material having a second coefficient of thermal expansion; and
    the circuit substrate is deflected from the plane due to a difference between the first coefficient of thermal expansion and the second coefficient of thermal expansion during a thermal cycle.

13. The silicon photomultiplier according to claim 12, wherein the thermal cycle is in a range from −55 degrees Celsius to +150 degrees Celsius.

14. The silicon photomultiplier according to claim 10, wherein an aspect ratio of the longer dimension to the shorter dimension is greater than or equal to 2 to 1.

15. The silicon photomultiplier according to claim 10, wherein:
    adjacent pairs of the plurality of pixel array circuits are separated by a gap in a direction aligned with the shorter dimension and overlap by an overlap in the direction aligned with the longer dimension.

16. The silicon photomultiplier according to claim 10, wherein the silicon photomultiplier includes at least two pixel array circuits in the sequence.

17. The silicon photomultiplier according to claim 10, wherein:
the plurality of pixel array circuits are bonded to each substrate module in pairs, each pair including a first pixel array circuit and a second pixel array circuit; and
the first pixel array circuit is bonded to the first rectangular portion and the second pixel array circuit is bonded to the second rectangular portion.

18. The silicon photomultiplier according to claim 10, wherein each of the plurality of substrate modules has a first edge configured to couple to a previous substrate module in the sequence and a second edge configured to couple with a subsequent substrate module in the sequence, the first edge having a first key feature and the second edge having a second key feature, the first key feature and the second key feature having teeth configured to interlock when brought together at a seam.

19. An optical receiver including:
an optical assembly configured to focus light from a field of view; and
a silicon photomultiplier including:
a printed circuit board having a longer dimension aligned with a long axis and a shorter dimension aligned with a short axis;
a carrier soldered to the printed circuit board, the carrier including a plurality of substrate modules, each substrate module being a monolithic structure including a first rectangular portion spatially offset from a second rectangular portion, the plurality of substrate modules arranged in a sequence aligned with the long axis wherein adjacent pairs of substrate modules in the sequence are bonded at a seam with a flexible adhesive so that the carrier can flex as the printed circuit board is curved along the long axis;
a window including a plurality of glass lids that bonded to sidewalls of the carrier in a sequence, wherein glass seams are formed between adjacent pairs of glass lids in the sequence; and
a plurality of pixel array circuits bonded to the carrier in a sequence that is staggered with respect to a direction aligned with the long axis, the silicon photomultiplier configured to detect the light from the field of view through the window.

20. The optical receiver according to claim 19, wherein the glass seams of the window do not overlap with seams of the carrier.

\* \* \* \* \*